United States Patent
Sun et al.

(10) Patent No.: US 7,741,131 B2
(45) Date of Patent: Jun. 22, 2010

(54) LASER PROCESSING OF LIGHT REFLECTIVE MULTILAYER TARGET STRUCTURE

(75) Inventors: Yunlong Sun, Beaverton, OR (US); Steve Harris, Hillsboro, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 11/754,214

(22) Filed: May 25, 2007

(65) Prior Publication Data

US 2008/0293166 A1    Nov. 27, 2008

(51) Int. Cl.
*H01L 21/00* (2006.01)
(52) U.S. Cl. .................. 438/7; 257/E21.521; 216/85
(58) Field of Classification Search .......... 438/7; 257/E21.521, E21.524; 216/84, 85
See application file for complete search history.

(56) References Cited

U.S. PATENT DOCUMENTS

| | | | |
|---|---|---|---|
| 4,141,780 A * | 2/1979 | Kleinknecht et al. ........ | 117/85 |
| 5,523,543 A * | 6/1996 | Hunter, Jr. et al. ..... | 219/121.62 |
| 5,577,137 A * | 11/1996 | Groger et al. ................ | 385/12 |
| 6,315,917 B1 * | 11/2001 | Shieh .......................... | 216/85 |
| 6,703,582 B2 | 3/2004 | Smart et al. | |
| 7,394,476 B2 * | 7/2008 | Cordingley et al. .......... | 347/224 |
| 2002/0167581 A1 | 11/2002 | Cordingley et al. | |
| 2006/0216927 A1 | 9/2006 | Cordingley et al. | |

FOREIGN PATENT DOCUMENTS

WO     2006-073888 A2    7/2006

OTHER PUBLICATIONS

Sun, Yunlong, Laser Processing Optimization for Semiconductor Based Devices, PhD Dissertation submitted to the Faculty of the Oregon Graduate Institute of Science and Technology, Beaverton, Oregon, Feb. 1997.
International Preliminary Report on Patentability; Dec. 10, 2009; for PCT/US2008/064636 filed May 23, 2008.

* cited by examiner

*Primary Examiner*—W. David Coleman
(74) *Attorney, Agent, or Firm*—Stoel Rives LLP (57) ABSTRACT

A solution to an interference effect problem associated with laser processing of target structures entails adjusting laser pulse energy or other laser beam parameter, such as laser pulse temporal shape, based on light reflection information of the target structure and passivation layers stacked across a wafer surface or among multiple wafers in a group of wafers. Laser beam reflection measurements on a target link measurement structure and in a neighboring passivation layer area unoccupied by a link enable calculation of the laser pulse energy adjustment for a more consistent processing result without causing damage to the wafer. For thin film trimming on a wafer, similar reflection measurement information of the laser beam incident on the thin film structure and the passivation layer structure with no thin film present can also deliver the needed information for laser parameter selection to ensure better processing quality.

21 Claims, 7 Drawing Sheets

LASER PROCESSING OF LIGHT REFLECTIVE MULTILAYER TARGET STRUCTURE

COPYRIGHT NOTICE

© 2007 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

The present disclosure relates to laser processing of multilayer process targets and, in particular, to controlling the impact of constructive or destructive interference effects on the amount of laser energy absorbed by a process target and on process quality.

BACKGROUND INFORMATION

Severing an electrically conductive link of an integrated circuit (IC) chip and trimming thin film on a silicon wafer are two examples of laser processing of light reflective multilayer structures. One of the major challenges associated with laser processing of such process targets is that the constructive or destructive interference effect stemming from different thicknesses of the multiple passivation and target material layers affects the percentage of laser energy that can be effectively absorbed by the link or thin film process target. This in turn affects the process result when constant laser pulse energy is used to process the process target. In some cases, when the interference effect reduces the percentage of laser energy absorbed by the process target, incomplete blowing of the link or trimming of the thin film results in a failed process. In some other cases, when the interference effect increases the percentage of laser energy absorbed by the process target, over-processing results in poor process quality such as over-blowing a passivation layer. Interference effects significantly affect the risk of damage to the silicon wafer as well. Variation of the interference effect is related to the variation of passivation layer thickness for a given number of passivation layers, passivation layer material, link or thin film thickness and material, laser wavelength used, and other such factors. Unfortunately, it is very difficult to make a passivation layer thickness uniform across the surface of a wafer or among multiple wafers in a group of wafers. This makes laser processing inconsistent and difficult to control. Moreover, the overlying passivation layer thickness and material type affect the link blowing process because the rupture behavior depends on these characteristics.

Interference effects on laser processing resulting from multiple layer structure parameter variation, including passivation layer thickness, have been reported and analyzed in detail by a variety of publications, including applicant's PhD thesis, titled: "Laser processing optimization of semiconductor based devices," YL Sun, Oregon Graduate Institute of Science & Technology, 1987 (Sun thesis). The Sun thesis also analyzed in detail the impact on memory chip link processing of different thicknesses of the overlying passivation layer.

U.S. Patent Application Pub. No. 2006/0216927 A1 of Cordingley, et al. ('927 publication) proposed adjusting laser pulse energy by measuring at least one of a thickness and reflectance of a layer to determine a variation of a laser pulse characteristic. The '927 publication suggested several approaches to determining such variation, including (1) simply measuring reflectance from the target, (2) measuring the passivation layer thickness and material refractive index with ellipsometry or spectral analysis, and (3) measuring reflectance at two different wavelengths and calculating the thickness of the oxide (i.e., the passivation layer). There are problems associated with each of these proposed approaches.

For proposed approach (1), in the case of link processing, the link width is about 1.0 µm. The smallest practicable laser beam spot size for a laser processing system is typically larger than the link width, therefore, a simple reflectance measurement with the laser beam or other system light source provides a mixture of reflectance contributions from the link structure and from the neighboring structure on the silicon wafer with no link present (impacted by all of the different passivation layers stacked over them). The '927 publication stated that positioning the laser spot relative to the link twice in different locations enabled derivation of reflection information from the link portion. The teaching of the '927 publication was to use only this reflection information from the link to control the processing laser parameters. As discussed in the Sun thesis, however, the reflection information from the multilayer structure neighboring but not including the link and the passivation layer structure underlying the link also plays very significant roles in the successful link processing. Contrary to what was suggested by the '927 publication, a higher reflectance measured from the top surface of the link does not necessarily dictate higher laser energy to achieve better process quality.

For proposed approach (2), the problem is that the measurement is performed off line with ellipsometer or spectral analysis equipment, which off-line measurement increases manufacturing cost and is very time consuming. Moreover, these techniques can work when there is only one layer overlying the link and when the complex refractive index of the link material is well known. For acceptable accuracy, the measuring beam spot size has to be smaller than the link width. This is impractical with most commercially available ellipsometers and spectral analysis equipment. For the case in which there are multiple passivation layers overlying the link, or in which the complex refractive index of the link material is unknown, it is almost impossible to determine the thickness of each layer and its refractive index. On the other hand, if successful, this measurement provides information about only the passivation layer overlying the link. This measurement does not provide information about risk of laser damage to the silicon wafer in the area neighboring the link because the issue of passivation layers stacked over the wafer surface region unoccupied by the link is not addressed.

For proposed approach (3), there are two different lasers or light sources required for making the measurement. The '927 publication stated that, when the reflectance at two different wavelengths is measured, the passivation layer thickness can be calculated with the known refractive index of the passivation layer material. Again, this proposal fails to realize that, to make the proposed practice feasible, one has to meet an impracticably realizable condition that the light spot size be smaller than the link width. There is also required knowledge of the complex refractive index of the link material. The measured reflectance of the overlying passivation layer represents not only the behavior of the overlying passivation layer itself, but also the behavior of its interface with the link, as taught by the Sun thesis. Moreover, whenever the link material, such as polysilicon, is partly transmissive of laser output, the underlying passivation layer also contributes to the measured reflectance.

The '927 publication acknowledged the issue of link width and laser beam spot size and proposed performing more measurements with the laser beam spot shifted to different locations relative to the link to derive reflection information by the link structure. This approach is tedious, requiring a long time to carry out. More importantly, the '927 publication failed to teach or appreciate the importance of the layer structure neighboring the link on the link laser processing and laser parameter selection or the importance of the underlying passivation layer structure on the link processing. Therefore, selection of laser pulse characteristics based on the thickness and reflectance measurements of a layer over a target structure, as taught by the '927 publication, would afford no warranted improvement of the laser processing.

SUMMARY OF THE DISCLOSURE

Preferred embodiments of a laser processing technique solve the interference effect problem by adjusting laser pulse energy or other laser beam parameter, such as laser pulse temporal shape, based on light reflection information of the target structure and passivation layers stacked across the wafer surface or among multiple wafers in a group of wafers. Laser beam reflection measurements on a target link measurement structure and in a neighboring passivation layer area unoccupied by a link enable calculation of the laser pulse energy adjustment for a more consistent processing result without causing damage to the wafer.

With the reflection information from the target link measurement structure and neighboring passivation layer area, in association with prior knowledge about the general passivation layer thickness variation trend across the wafer, laser pulse energy used for processing the wafer can be optimized based on a link processing computer simulation model. Information such as a laser process window for the structure and the soundness of the link structure design and manufacturing process can also be derived from the reflection measurements and computer simulation modeling. For thin film trimming on a wafer, similar reflection measurement information of the laser beam incident on the thin film structure and the passivation layer structure with no thin film present can also deliver the needed information for laser parameter selection to ensure better processing quality.

This direct measurement of the reflection of the laser beam can be readily implemented in practice and does not need information about detailed parameters of the passivation layer stack, such as, for example, the different material used for each layer and the complex reflective indices of the link material and passivation material.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
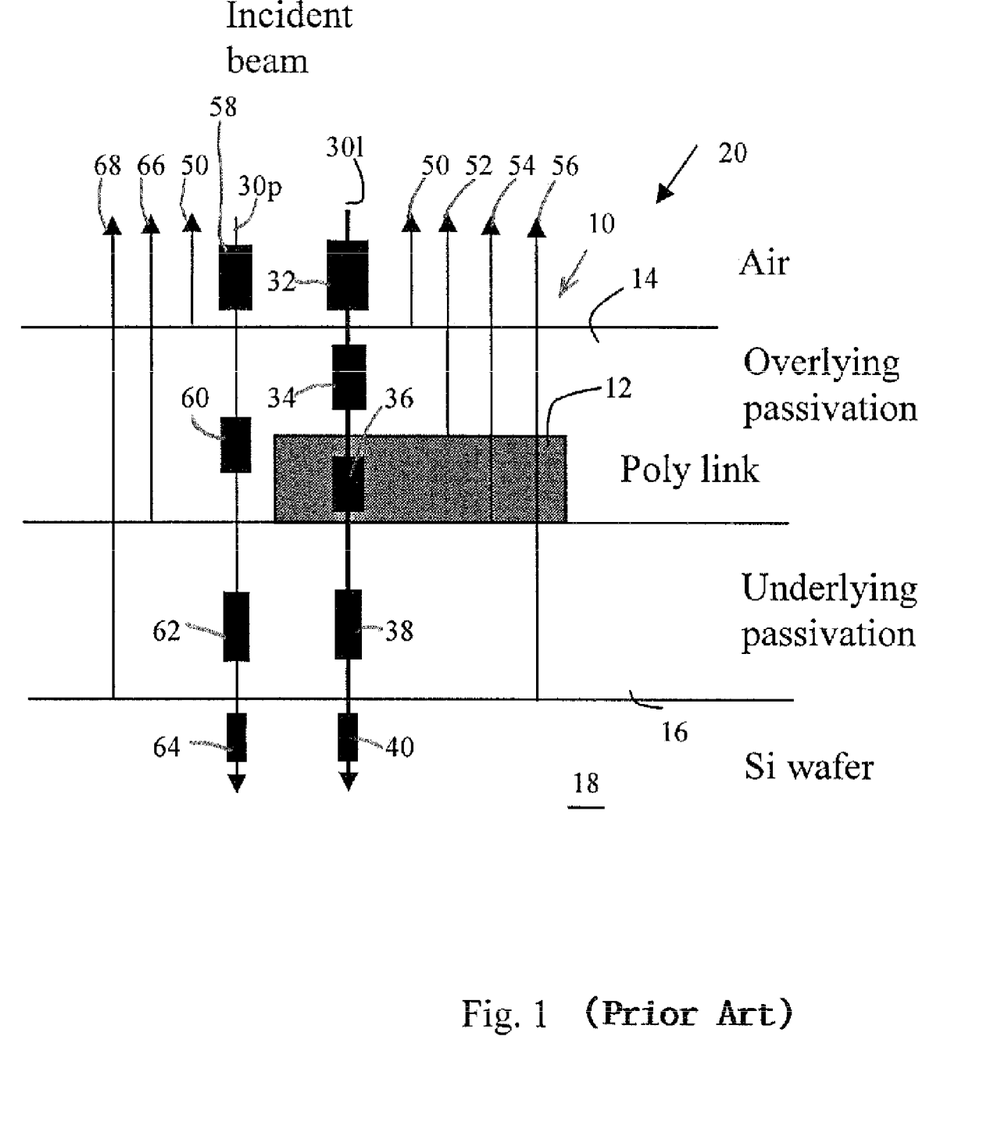
FIG. 1 is a cross-sectional view of an electrically conductive link structure including overlying and underlying passivation layers supported on a substrate.

FIG. 1 shows in cross-section a simplified electrically conductive link structure that includes a single overlying passivation layer and a single underlying passivation layer. With reference to FIG. 1, a link structure 10 includes an electrically conductive link 12 positioned between an overlying passivation layer 14 of dielectric material and an underlying passivation layer 16 of field oxide (typically silicon dioxide) material. In most practical devices, underlying passivation layer 16 can be composed of several different layers made of different materials. Link 12 itself can also be composed of more than one layer made of different materials. Link structure 10 is supported on a substrate 18. For purposes of the descriptions presented below, link structure 10 and substrate 18 are parts of a semiconductor wafer 20 of which substrate 18 is preferably made of silicon.

In laser processing of links, the beam spot size is larger than the link width. The following description illustrates the incidence of center and side area portions of a processing laser beam 30 of Gaussian shape on and outside of link structure 10. A laser beam portion 30$l$ represents the center area of laser beam 30 that is incident on link structure 10, and a laser beam portion 30$p$ represents the side area portion of laser beam 30 that is incident on the passivation layer stack in the neighboring region outside of link 12.

FIG. 1 shows laser beam portion 30$l$ that is incident on and propagates through link structure 10 to substrate 18. FIG. 1 is annotated to show the absorption and reflection of laser beam 30 at different depths in link structure 10. Rectangular boxes of different widths distributed along the path of laser beam portion 30$l$ as it propagates through link structure 10 illustrate qualitatively the amounts of laser energy at different locations along the beam path after reflection at different interfaces and absorption by link 12. Upwardly pointing arrows indicate occurrences of reflected light at media interfaces outside of and within link structure 10. FIG. 1 also shows the path of laser beam portion 30$p$ that is incident on and propagates through overlying passivation layer 14 and underlying passivation layer 16 in a region neighboring but unoccupied by link 12. The rectangular boxes of different widths distributed along the path of laser beam portion 30$p$ and the upwardly pointing arrows represent the same phenomena as is described for link structure 10 (except for the presence of link 12).

For laser beam portion 30*l*, the width of box 32 represents an amount of energy of laser beam 30 as it propagates at this location through air for incidence on overlying passivation layer 14. Box 34 of narrower width than that of box 32 represents the amount of laser energy in overlying passivation layer 14 before laser beam 30 reaches link 12. The width of box 36 within link 12 narrows to indicate less laser energy of laser beam portion 30*l* as it propagates through link 12. The reduction in laser energy results from the absorption by link 12 and reflection at the overlying passivation layer 14—link 12 interface. The absorption depth in a polysilicon link 12 is 5 μm at a 1.047 μm wavelength of laser beam 30. The width of a box 38 represents a residual amount of energy of laser beam 30 as it exits link 12 and propagates through underlying passivation layer 16 and into substrate 18. Box 40 represents the beam energy absorbed within substrate 18. If its initial energy is sufficiently high, laser beam 30 could damage underlying layer 16 alone or along with substrate 18.

Direction arrows 50, 52, 54, and 56 represent occurrences of light reflections caused by the propagation of laser beam portion 30*l* through link structure 10 at, respectively, its air-overlying passivation layer 14 interface, overlying passivation layer 14—link 12 interface, link 12—underlying passivation layer 16 interface, and underlying passivation layer 16—substrate 18 interface. (FIG. 1 does not show the secondary reflections of these reflected beams at the next interface along their paths.) When these multiple light reflections produced at their various associated locations intersect with one another, the light reflections create constructive or destructive interference effects based on their phase relationships. These interference effects complicate the intended processing by laser beam 30. The final reflectance of the laser beam from the target depends on these interference effects and is, therefore, a function of the numerous previously mentioned factors.

For laser beam portion 30*p*, the width of box 58 represents an amount of energy of laser beam 30 as it propagates at this location through air for incidence on overlying passivation layer 14. Boxes 60, 62, and 64 of progressively narrower widths represent the effect of beam energy in, respectively, overlying passivation layer 14, underlying passivation layer 16, and substrate 18. Since no link material absorbs the energy of incident laser beam portion 30*p*, the incident laser energy represented by box 62 in substrate 18 presents a large damage risk to it, although the incident laser energy represented by box 58 is less intense than the energy of the part of laser 30 represented by box 32.

Direction arrows 50, 66, and 68 represent occurrences of light reflections caused by the propagation of laser beam portion 30*p* at, respectively, the air-overlying passivation layer 14 interface, overlying passivation layer 14—underlying passivation layer 16 interface, and underlying passivation layer 16—substrate 18 interface.

Figure 2:
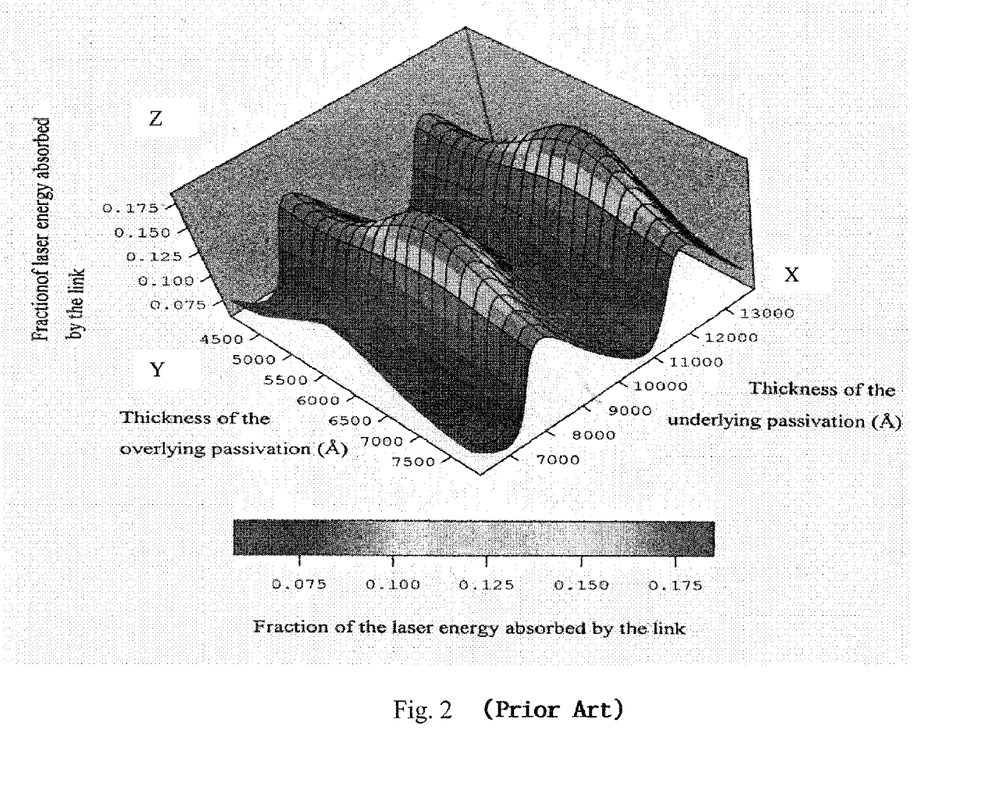
FIG. 2 shows the impact of interference effects on laser beam energy absorbed by the link and overlying and underlying passivation layers of the link structure of FIG. 1.

FIG. 2 is a three-dimensional plot showing the periodicity of interference effects on laser beam energy absorbed by link 12 versus overlying and underlying passivation layers 14 and 16 of link structure 10 of FIG. 1. The X-axis represents the thickness of underlying passivation layer 16, the Y-axis represents the thickness of overlying passivation layer 14, and the Z-axis represents the percentage of incident laser energy absorbed by link 12. The percentage of laser energy absorbed by link 12 is also indicated by the gray scale bar. Interference effects impact the process result when constant laser pulse energy is used for the process. The variation of the interference effect is related to the variation of the passivation structure parameters, such as number and thicknesses of the passivation layers and the materials of which the passivation layers are made, the structure and thickness of link 12 itself and the material of which link 12 is made, and the physical properties of silicon substrate 18. For the case in which a link target or a thin film partly transmits laser energy, underlying passivation layer 16 and substrate 18 also play an important role in the interference effects, as shown in FIG. 2. The interference effect occurring for the incident laser energy outside of link 12 can be calculated in the same manner. The amount of laser energy transmitted into substrate 18 determines the risk of damage to it.

The thickness of overlying passivation layer 14 also impacts the laser processing associated with the breakdown of the passivation layer because of stress buildup within link structure 10. In general, a thinner overlying passivation layer 14 requires less energy to break it open, and a thicker overlying passivation layer 14 requires more laser energy to break it open. The break open event could occur at a later time for a thicker overlying passivation layer than for a thinner passivation layer, for a given fixed laser pulse energy and pulse shape. A break open event occurring after an excessively long laser energy exposure time could result in an irregular opening of the passivation layer, as a result of a larger heat affected zone, as indicated in the Sun thesis.

The preferred embodiments disclosed solve this problem by adjusting the laser pulse energy or other laser beam parameter, such as the temporal shape of the laser pulse, in response to the reflection information about the entire target structure and passivation layer stack in several predetermined representative locations across the entire wafer and among multiple wafers in a group, in association with prior knowledge about the passivation thickness variation trend across the wafer.

For a given manufacturer's process technology and know-how, the overlying passivation layer thickness variation typically exhibits a relatively repeatable trend across a wafer, such as relatively uniform thickness around the edge of the wafer and less thickness in its center. Combining the reflection variation information with the known trend of the overlying passivation thickness variation, one can determine whether the overlying passivation layer is becoming thinner or thicker, and determine a relatively accurate absolute thickness of the overlying passivation layer. Several representative locations of interest can, therefore, be predetermined, such as several locations around different areas of the wafer edge, several locations around the middle of the wafer, and several locations at the center area of the wafer. The wafer manufacturer, based on its experience, can readily identify the appropriate locations.

Based on the laser beam spot size being typically greater than the link width and the interference effect contributed by the underlying passivation layer playing a role in laser processing, the measurement technique described below acquires adequate reflection information for optimizing laser processing of a reflective multiple layer structure.

Before pulsed laser processing takes place, as in one preferred embodiment, a lower power continuous-wave (CW) laser beam emitted by the same laser is used to scan assisting targets added to link banks of wafer 20 at predetermined locations across it. Each assisting target has the same structure as that of link structure 10, except that the assisting target has a width that is no less than the laser beam spot size. Skilled persons will appreciate the advantage of using the processing pulsed laser to deliver the measurement CW laser beam is that it is the simplest and most cost effective. Moreover, the measurement CW laser beam has the same wavelength as that of the processing laser, so that the measured reflection and interference effect is a direct representation of the reflection and interference effect during actual laser link processing.

Figure 3A:
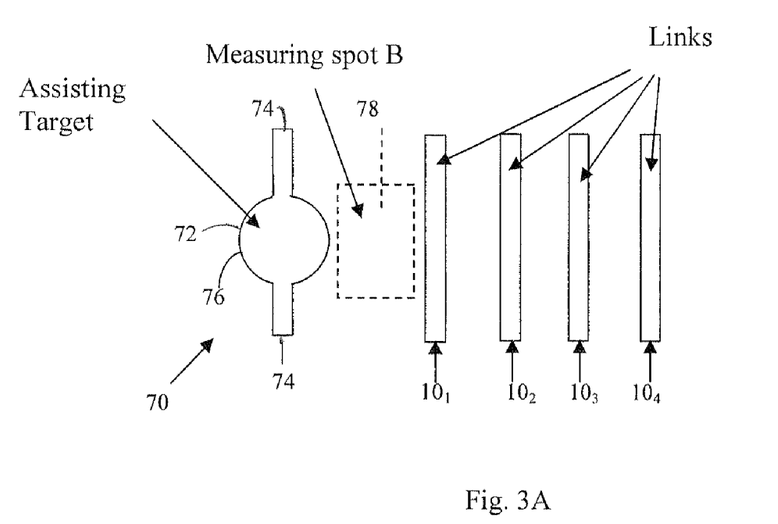
FIGS. 3A and 3B are diagrams showing different embodiments of reflectance measurement regions each having a target link measurement structure and neighboring passivation layer measurement location associated with a group of links that may undergo laser processing.
Figure 3B:
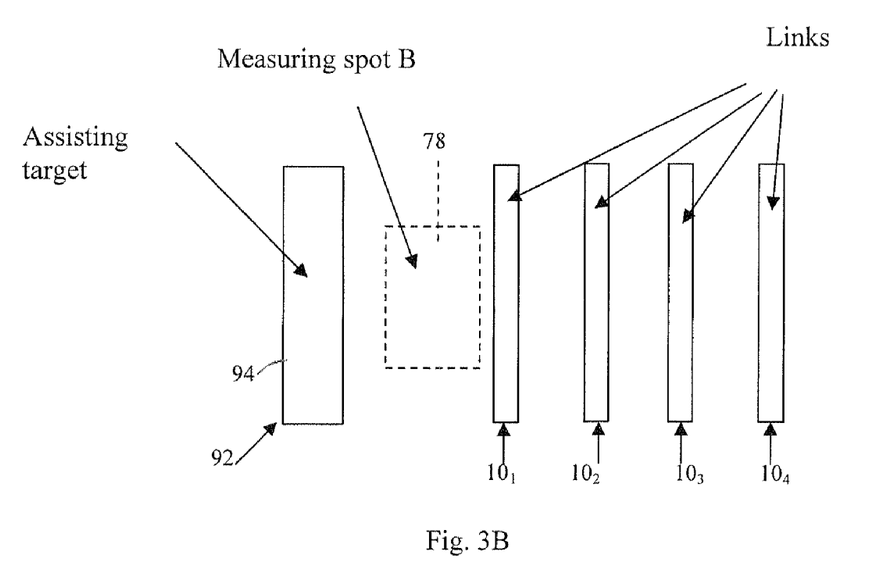

FIGS. 3A and 3B show top views of two embodiments of an assisting target and an associated reflection measurement area.

With reference to FIG. 3A, in a first embodiment, an assisting target 70 is located at a region of wafer 20 near a bank of four link structures $10_1$, $10_2$, $10_3$, and $10_4$, each of which is structured as described above with reference to link structure 10. Assisting target 70 includes an electrically conductive link 72 having two generally rectangular end portions 74 joined by a circular center portion 76. Circular center portion 76 has a diameter providing a link width that is not less than the spot size of a laser beam incident on the upper major surface of wafer 20. The overall length of assisting target 70 is preferably the same as the lengths of link structures $10_1$-$10_4$. A measurement region 78 is situated between and neighbors assisting target 70 and link structure $10_1$ where passivation layers 14 and 16 are present but no link material is present.

Figure 4:
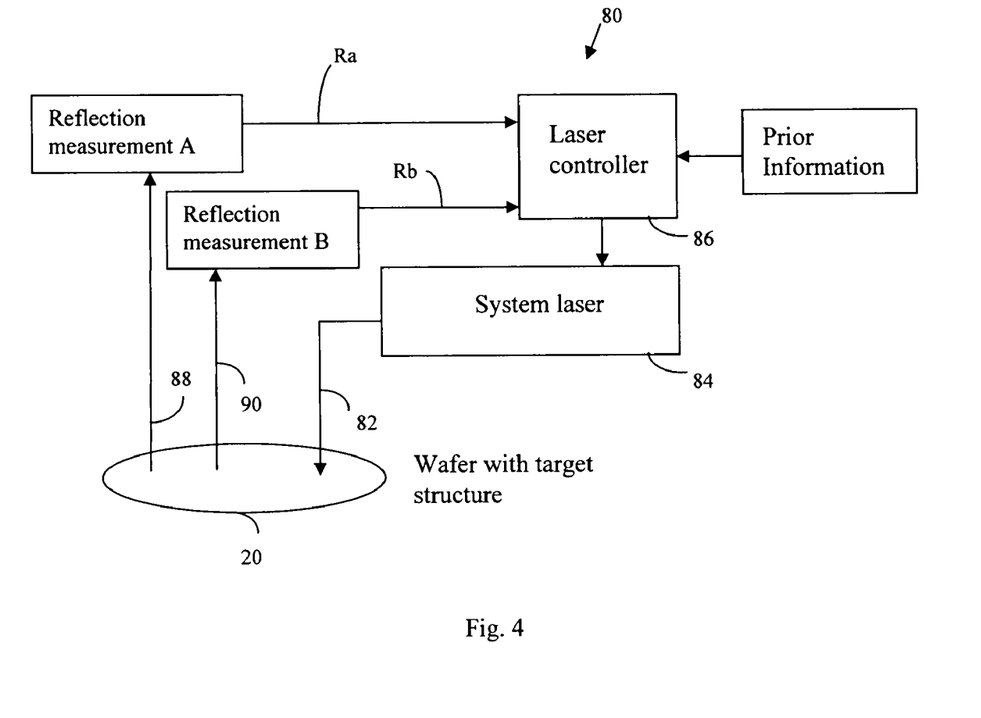
FIG. 4 is a block diagram showing and illustrating the operation of a laser processing system performing measurements of the intensity of light reflected from assisting target and measuring regions of a semiconductor wafer.

FIG. 4 is a block diagram showing and illustrating the operation of a laser processing system 80 performing measurements of the intensity of light reflected from assisting target 70 and measurement region 78 of wafer 20. With reference to FIGS. 3A and 4, a CW scan laser beam 82 emitted by a system laser 84 has an output energy established by a laser controller 86 at a sufficiently low level so as not to damage wafer 20. Scan laser beam 82 incident on and fully encompassed within center portion 76 reflects off assisting target 70 as a reflected beam 88 and is processed as a reflection measurement, A, to provide reflection intensity information, Ra. Reflection intensity information Ra, derived from light reflected by assisting target 70 is a pure measure of the interference effect in the direction vertical to link 72, without contribution of any interference effect of scan laser beam 82 falling outside of the boundaries of electrically conductive link 72 of assisting target 70. Scan laser beam 82 incident on and fully encompassed by measurement region 78 reflects off the stacked passivation layers 14 and 16 on substrate 18 as a reflected beam 90 and is processed as reflection measurement, B, to provide reflection intensity information, Rb. Reflection intensity information Rb, derived from light reflected by measurement region 78 is a pure measure of the interference effect of the stacked passivation layers 14 and 16 on wafer 20 with no link 12 sandwiched in the passivation layer stack.

Laser processing system 80 then calculates with the basic link design parameters, such as link 12 material and its thickness; passivation layer stack information including, for example, nominal thickness of each of layers 14 and 16 and the materials used; and the reflection intensity information Ra, the passivation layer thickness variation trend across wafer 20, and the location of assisting target 70 producing Ra, to determine an adjustment of the laser pulse energy relative to a nominal value (i.e., an initially proposed laser energy). Laser processing system 80 also calculates the laser energy upper limit, based on the above information, and Rb for preventing damage to silicon substrate 18. Laser processing system 80 is thereafter able to provide a final selection of the laser pulse energy for use in processing links 12 in the area surrounding the location of this particular assisting target 70. From the calculated laser energy upper limit and the proposed laser energy, the manufacturer learns beforehand information such as, for example, the size of the laser processing window, the soundness of the link structure design and passivation layer process technologies, and expected laser link processing result and yield.

For the case in which link 12 is made of metal with adequate thickness such that it is opaque to scan laser beam 82, Ra represents a pure measure of the interference of overlying passivation layer 14 in the region over link 12. With the additional information Rb, interference effects resulting from underlying passivation layer 16 after link 12 is mostly removed can be estimated for better control of the laser pulse energy and laser pulse shape chosen for the process. In general, for example, a thicker overlying passivation layer 14 requires a fast-rising laser pulse leading edge for a successful process, and a large amount of laser energy absorbed by substrate 18 after link 12 is mostly removed requires a sharper decline of the laser pulse failing edge.

With reference to FIG. 3B, in a second embodiment, an assisting target 92 replaces assisting target 70 at the location on wafer 20 where assisting target 70 of FIG. 3A resides. Measurement region 78 and link structures $10_1$-$10_4$ of FIG. 3B are of the same structures and in the same locations as their respective counterparts in FIG. 3A. Assisting target 92, which has the same structure as that of target structure 10, includes an electrically conductive link 94 in the form of a rectangle having a width that is not less than the spot size of a laser beam incident on the upper major surface of wafer 20. The length of assisting target 92 is preferably the same as the lengths of link structures $10_1$-$10_4$. Scan laser beam 82 scans across link 94 and measurement region 78. Reflection intensity information Ra represents the light reflection intensity measured when the beam spot is centered at link 94. Reflection intensity information Rb is collected when scan laser beam 82 is aimed at measurement region 78. Based on Ra and Rb, the laser spot size, and the width of link 94, the reflection intensity information of the laser energy overlapping link 94 can be calculated. The result of this calculation can be used in determining the proposed laser pulse energy, laser processing window, laser damage to substrate 18, preferred laser pulse shape, and other such parameters.

Another preferred embodiment entails impinging scan laser beam pulses on an intact link having a width that is less than the scan laser beam pulse spot sizes. When the link width, laser beam spot sizes, laser energy distribution across a laser beam spot, and relative positioning of the laser beam spot to the link for two different light beam reflection measurements are accurately known, the reflection information from the link structure and the reflection information from the structure outside the link can both be derived.

Figure 5A:
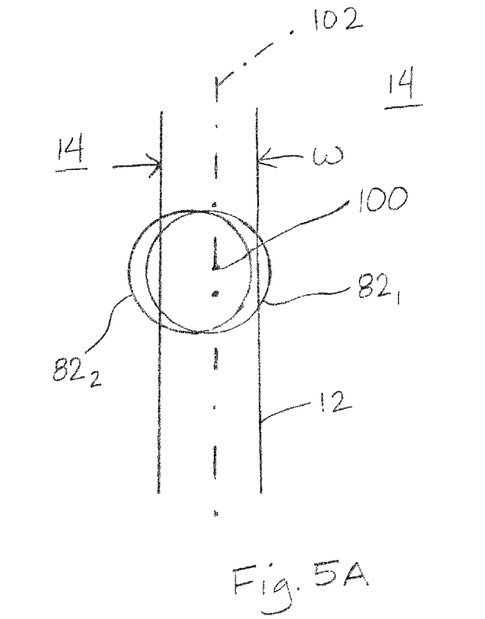
FIGS. 5A, 5B, and 5C are top plan views of the electrically conductive link structure of FIG. 1 showing three different placements of two scan laser beam spots for carrying out two different light beam reflection measurements in each example.
Figure 5B:
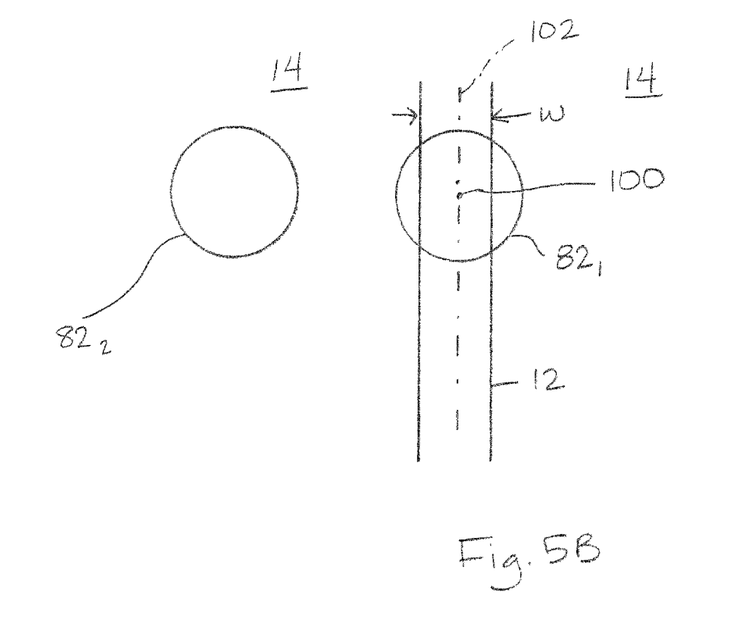
Figure 5C:
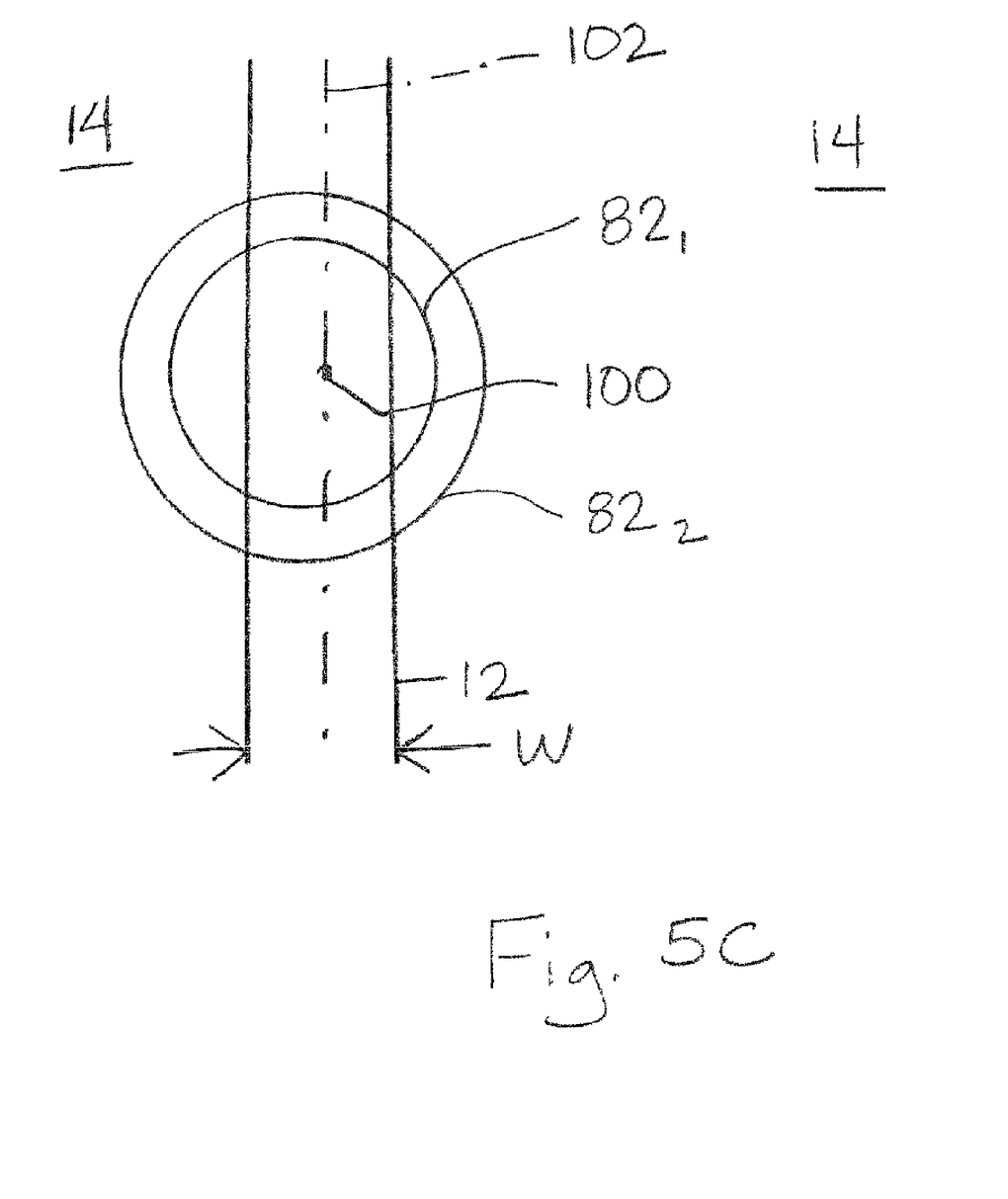

FIGS. 5A, 5B, and 5C show several examples of laser beam spot placements for carrying out the two light beam reflection measurements.

With reference to FIG. 5A, laser beam pulses $82_1$ and $82_2$ impinge link structure 10 at different lateral positions relative to a point 100 on a center line 102 extending along the length of link 12. Laser beam pulses $82_1$ and $82_2$ are of the same spot size and have a diameter that is greater than width, w, of link 12. The laser beam spots overlap link 12 and each other.

With reference to FIG. 5B, laser beam pulse $82_1$ impinges link structure 10, and laser beam pulse $82_2$ impinges overlying passivation layer 14 and underlying layer 16 outside of link structure 10. Laser beam pulses $82_1$ and $82_2$ are of the same spot size and have a diameter that is greater than the width, w, of link 12. The laser beam spots do not overlap each other.

With reference to FIG. 5C, laser beam pulses $82_1$ and $82_2$ of different, concentric spot sizes impinge link structure 10. The different spot sizes of laser beam pulses $82_1$ and $82_2$ can be achieved by changing the focus of one of them.

In each of the examples of FIGS. 5A, 5B, and 5C, the light beam reflection measurements taken for laser beam pulses $82_1$ and $82_2$ provide reflection information for different light beam intensities reflected by link 12 because their associated portions of the Gaussian beam intensity profile of scan laser beam 82 incident on link 12 differ. In the example of FIG. 5B, the difference between the light beam intensities of scan laser beam 82 reflected by link 12 is represented by only the reflection of laser beam pulse $82_1$ because laser beam pulse $82_2$ impinges passivation layers 14 and 16 outside of link structure 10. Using the reflection information relating to the link structure and the reflection information either partly or entirely outside the link structure, the proposed laser pulse energy, laser processing window, laser damage to the substrate, preferred laser pulse shape, and other processing parameters can be determined.

Laser processing takes into account all of the following three factors. First, in general, passivation layer thickness variation exhibits a repeatable trend across a wafer in one's manufacturing practice. For example, the passivation layer typically is thinner in the center area of the wafer and thicker in the outside area of the wafer. The manufacturer can determine this trend using other techniques or off-line equipment, such as an ellipsometer. Second, as indicated in FIG. 2, the interference effects are quite periodic, meaning that a lower than nominal reflection value could indicate the passivation layer is thicker or thinner than its nominal value. Third, typically, if one neglects the impact of the reflection of the laser energy by the target resulting from interference effects, in the case of link processing, when the overlying passivation layer is thicker, a greater amount of laser energy and a faster-rising laser pulse leading edge would be needed for best processing quality.

The reflection information from low power CW scan laser beam 82 can be used in combination with the general passivation variation trend across wafer 20 to further optimize the laser parameters used on different areas of wafer 20, based on an optimization theory developed in the Sun thesis.

The above information assists in determining for different areas across wafer 20 the extent of the width of the laser processing window. This information helps the wafer manufacturer to understand whether the IC structure design and process are sufficiently sound for high yield and consistent laser processing results.

Laser controller 86 accomplishes control of the pulsed laser energy by either direct control of the pumping intensity of the laser or operation of a laser energy attenuator, such as the liquid crystal attenuator used in Model Nos. 9820 and 9830 link processing systems, or the laser pulse picker used in Model Nos. 9830 and 9850 link processing systems. Laser controller 86 can accomplish control of the pulse energy profile shape of processing laser beam 30, such as the tailored laser pulse used in Model No. 9830 HDT link processing systems. All of the above-mentioned systems are available from Electro Scientific Industries, Inc., the assignee of this patent application.

The above-described reflection measurement scan technique does not significantly burden laser processing and does not require information such as the complex refractive index of the material, which is quite difficult to obtain, especially for popular links made of alloys such as WN and AlN. This technique works irrespective of the number of different layers covering the link or the silicon wafer, does not entail significant modification of currently available laser processing system hardware, and does not require additional hardware, such as an ellipsometer or spectral analysis equipment.

Figure 6A:
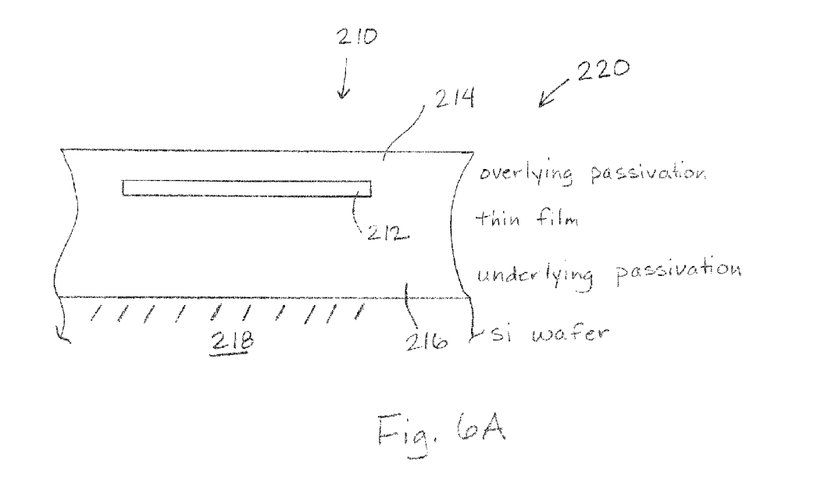
FIG. 6A is a cross-sectional view of an electrically resistive thin film structure including overlying and underlying passivation layers supported on a substrate.

The foregoing discussion directed to laser processing of links is applicable to laser trimming of thin film on a silicon substrate. FIG. 6A shows in cross-section a thin film structure 210 that closely resembles link structure 10 of FIG. 1. Thin film structure 210 includes an electrically resistive layer portion 212 positioned between an overlying passivation layer 214 of dielectric material and an underlying passivation layer 216 of field oxide (typically silicon dioxide) material. Thin film structure 210 is supported on a substrate 218. For purposes of the descriptions presented below, thin film structure 210 and substrate 218 are parts of a semiconductor wafer 220, of which resistive layer portion 212 is preferably made of nickel chromium and substrate 218 is preferably made of silicon. The typical thickness of the thin film is in the range of a few tens to a few hundreds of Angstroms.

Figure 6B:
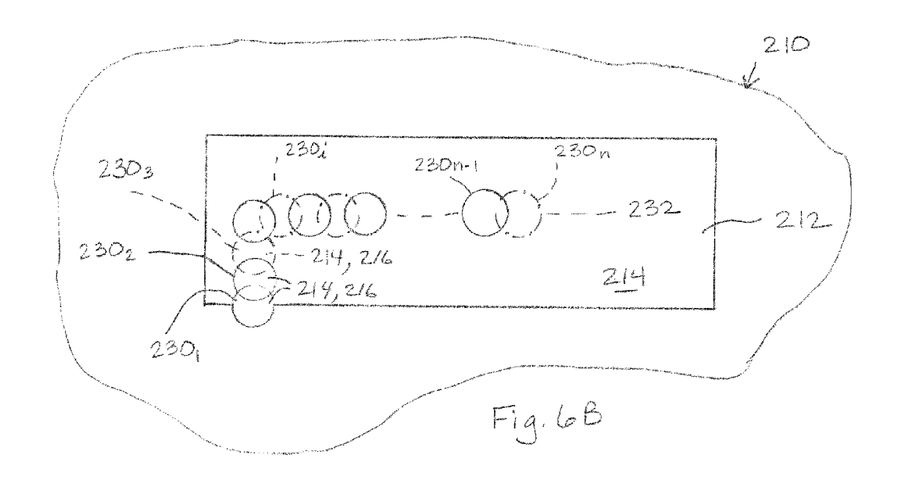
FIG. 6B is an enlarged top plan view of a laser trimming process that entails the depthwise removal of overlying passivation layer material and thin film material by successive multiple, partly overlapping laser beam pulses.

FIG. 6B shows a laser trimming process that entails the progressive depthwise removal of a region of resistive layer portion 212 by a series of partly overlapping pulses of a processing laser beam 230 moving along an L-shaped beam path 232. With reference to FIG. 6B, a first laser pulse $230_1$ of circular spot area causes depthwise removal of a circular region of resistive layer portion 212 and a consequent exposure of underlying passivation layer 216. Because of the insubstantial thickness of the thin film resistive layer portion 212, during thin film trimming, overlying passivation layer 214 does not blow off. A next succeeding laser pulse $230_2$ of circular spot area overlaps about one-third of the region removed by laser pulse $230_1$ and causes depthwise removal of about two-thirds of the previously intact region of resistive layer portion 212 presented by movement of laser beam 230 along beam path 232. Laser pulse $230_2$ delivers laser energy to the region of passivation layers 214 and 216 and silicon substrate 218 exposed by laser pulse $230_1$. A next succeeding laser pulse $230_3$ of circular spot area performs the same resistive layer portion removal and passivation layer and substrate exposure as described for laser pulse $230_2$. Successive laser pulses $230_i$ accomplish the incremental removal of electrically resistive portion 212 and passivation layer and substrate exposure as laser beam 30 progressively moves along beam path 232 until completion with laser pulse $230_n$. This overlap of thin film material over substrate 218 during trimming is analogous to that described for link structure 10.

Similar reflection measurement information of the laser beam incident on the thin film structure and the passivation layer structure with no thin film present can also deliver the needed information for laser parameter selection to ensure better processing quality. Skilled persons will appreciate that, for thin film trimming, an assisting target would not be necessary in performing the reflection measurements.

It will be obvious to those having skill in the art that many changes may be made to the details of the above-described embodiments without departing from the underlying principles of the invention. For example, a different suitable light source can be used as a substitute for scan laser beam 82. The scope of the present invention should, therefore, be determined only by the following claims.

The invention claimed is:

1. A method of laser processing a light reflective structure that has a major surface and includes a multilayer passivation structure and target material supported on a substrate, the light reflective structure characterized by a nonuniform distribution of passivation layer thickness across the major surface, comprising:

obtaining prior knowledge about the nonuniform distribution of the passivation layer thickness across the major surface;

performing a first light beam reflection measurement on a first region of the light reflective structure at a location where a portion of the target material is present, the measurement being performed at a first light beam wavelength while leaving operationally undamaged the first region and the substrate;

performing a second light beam reflection measurement on a second region of the light reflective structure in a vicinity of the first region and at a location where a portion of the multilayer passivation structure is present and where the target material is not present, the measurement being performed at a second light beam wavelength while leaving operationally undamaged the second region and the substrate and, the first and second light beam wavelengths being the same; and processing the first and second light beam reflection measurements to calculate absorption difference corresponding to the first and second light beam reflection measurements and the prior knowledge to determine a processing laser output parameter for laser processing a selected portion of target material in proximal location to the first and second regions.

2. The method of claim 1, in which the processing laser output parameter is laser pulse output energy.

3. The method of claim 1, in which the processing laser output parameter is temporal shape of laser pulse output energy.

4. The method of claim 1, in which the first region is a member of a set of multiple regions of the light reflective structure at locations where portions of the target material are present, and in which the performing a first light beam reflection measurement includes scanning a light beam to the locations of the multiple regions, the light beam having insufficient power to appreciably change physical properties of the target material at the locations.

5. The method of claim 1, in which the processing laser output is characterized by a spot size on the major surface, and in which the portion of the target material of the first region includes a target link measurement structure having a width that at least part of which is larger than or equal to the spot size, thereby to provide a measure of an interference effect of the first region without appreciable contribution of an interference effect of a neighboring portion of the multilayer passivation structure outside of the first region.

6. The method of claim 1, in which:
the processing laser output is characterized by a spot size on the major surface;
the portion of the target material of the first region includes a link having a width;
the first light beam reflection measurement is performed when the laser spot is generally centered about the width of the link; and
the processing to determine the processing laser output parameter includes calculating reflection information of laser pulse output energy overlapped with the link.

7. The method of claim 1, in which emissions from a laser source are used in performing the first and second light beam reflection measurements.

8. The method of claim 1, in which the selected portion of target material includes electrically conductive material.

9. The method of claim 1, in which the selected portion of target material includes electrically resistive material.

10. The method of claim 1, in which emissions from a laser source are used in performing the first and second light beam reflection measurements, and in which the laser source produces the processing laser output.

11. The method of claim 7, in which the laser source produces the processing laser output.

12. The method of claim 11, in which the emissions from the laser source in performing the first and second light beam reflection measurements are continuous-wave emissions and in producing the processing laser output are pulsed emissions.

13. The method of claim 8, in which the electrically conductive material includes a semiconductor device link.

14. The method of claim 13, in which the semiconductor device link is a memory link.

15. The method of claim 9, in which the electrically resistive material is of a thin film type.

16. A method of laser processing a light reflective structure that has a major surface and includes a multilayer passivation structure and electrically conductive link material supported on a substrate, the light reflective structure characterized by a nonuniform distribution of passivation layer thickness across the major surface, and the link material having a link width, comprising:

obtaining prior knowledge about the nonuniform distribution of the passivation layer thickness across the major surface;

providing a scanning light beam producing, when incident on the light reflective structure, a beam spot with a beam spot size that is larger than the link width;

positioning the scanning light beam at a first wavelength to perform a first light reflection measurement at a first location of the light reflective structure where the link material and multilayer passivation structure are present, the scanning light beam having a first beam spot with a beam spot size that covers a first region of the link material and a first region of the multilayer passivation structure outside of the first region of the link material;

positioning the scanning light beam at a second wavelength that is the same as the first wavelength to perform a second light reflection measurement at a second location of the light reflective structure in a vicinity of the first location and where at least one of the link material and multilayer passivation structure are present, the scanning light beam having a second beam spot with a beam spot size that covers at least one of a second region of the link material and a second region of the multilayer passivation structure outside of the link material; and processing the first and second beam reflection measurements to determine light reflection information relating to the link material and the multilayer passivation structure and, with the prior knowledge, to determine a processing laser output parameter for laser processing a selected portion of the electrically conductive link material in proximity to the first and second locations.

17. The method of claim 16, in which the beam spot sizes of the first and second beam spots are the same, and in which the first and second locations occupy different lateral positions relative to the link width such that the second beam spot covers the second region of the link material.

18. The method of claim 16, in which the beam spot sizes of the first and second beam spots are the same, and in which the first and second locations occupy different lateral positions relative to the link width such that none of the link material is covered by the second beam spot during the second light reflection measurement.

19. The method of claim 16, in which the beam spot sizes of the first and second beam spots are different, and in which the second beam spot covers the second region of the link material.

20. The method of claim 16, in which a laser produces the scanning light beam.

21. The method of claim 16, in which the electrically conductive link material includes semiconductor device link material.

* * * * *